Feb. 8, 1966

F. H. DILL

SWITCHING TRANSISTORS WITH CONTROLLED EMITTER-BASE BREAKDOWN

Filed Sept. 26, 1961

3,233,305

INVENTOR
FREDERICK H. DILL

BY John F. Ohlandt Jr.
ATTORNEY

United States Patent Office 3,233,305
Patented Feb. 8, 1966

3,233,305
SWITCHING TRANSISTORS WITH CONTROLLED EMITTER-BASE BREAKDOWN

Frederick H. Dill, Putnam Valley, N.Y., assignor to International Business Machines Corporation, New York, N.Y., a corporation of New York
Filed Sept. 26, 1961, Ser. No. 140,833
9 Claims. (Cl. 29—25.3)

This invention relates to transistors and, more particularly, to switching transistors of the junction type suitable for use in digital information systems.

As used in digital information systems for switching purposes, it is required that a junction transistor be transferred very quickly between a state in which it offers a low impedance to a flow of current across a pair of its terminals to a state in which it offers a high impedance across the same terminals.

The transition that is required in a switching operation by a transistor involves traversal of the output characteristic of the transistor from complete cutoff into saturation. Such operation is defined as large signal operation. It has been found that the design of a transistor for large signal operation requires a special type of transistor having certain parameters controlled so that the transistor will have as high an alpha and frequency response as possible and which when driven into saturation can be brought out of saturation to cutoff with a minimum of carrier storage. Without such a design for the transistor, resort must be made to the use of clamping circuits and power-limiting circuits, and the use of these imposes serious limitations on speed of operation.

A junction transistor that inherently meets the aforesaid requirements for switching purposes will have a high base to collector current amplification factor, a very low "on" resistance, a high avalanche or Zener collector breakdown voltage, a very low storage time, a specific emitter to base breakdown voltage, a high punch-through voltage, and for optimum frequency response, low collector capacitance.

Various transistors have been developed for meeting the requirements enumerated above. One example of such a transistor is that disclosed in Patent No. 2,810,870, assigned to the assignee of the present invention. Another example of such a transistor is disclosed in Patent No. 2,964,689, which is of the so-called mesa variety.

It has been found, however, in the prior art high speed switching transistors, that the emitter-base breakdown voltage is generally low, and it is to the mitigation of this deficiency that the present invention is especially directed.

When the various parameters of a transistor suitable for high speed switching are considered, a compromise becomes necessary among the conflicting demands that each of them entails. For example, there exists a compromise between obtaining a low base resistance and a thin base region and a good, that is, a reasonably high, emitter-base breakdown voltage. In addition, for the usual reasons, it is desired to have a graded impurity density in the base region of the transistor and also a graded collector junction.

It is, therefore, a principal object of the present invention to provide an improved switching transistor.

Another object is to provide a switching transistor having a superior emitter-base breakdown characteristic and concomitantly therewith, a low base resistance and a thin base region.

Another object is to provide a simple method of achieving a high speed switching transistor with a high emitter-base breakdown voltage.

The above objects are attained by the present invention, which, in its broadest aspect, envisions the fabrication of a high speed switching transistor by the initial formation of a crystalline body having disparately doped regions of opposite conductivity-type and by the judicious diffusion of impurities from the highly doped region into the less highly doped, thus providing a collector zone and a base zone having the requisite attributes for high speed operation and withal, creating the conditions for obtaining a high base-emitter breakdown characteristic.

The foregoing and other objects, features and advantages of the invention will be apparent from the following more particular description of a preferred embodiment of the invention, as illustrated in the accompanying drawings.

Figure 1:
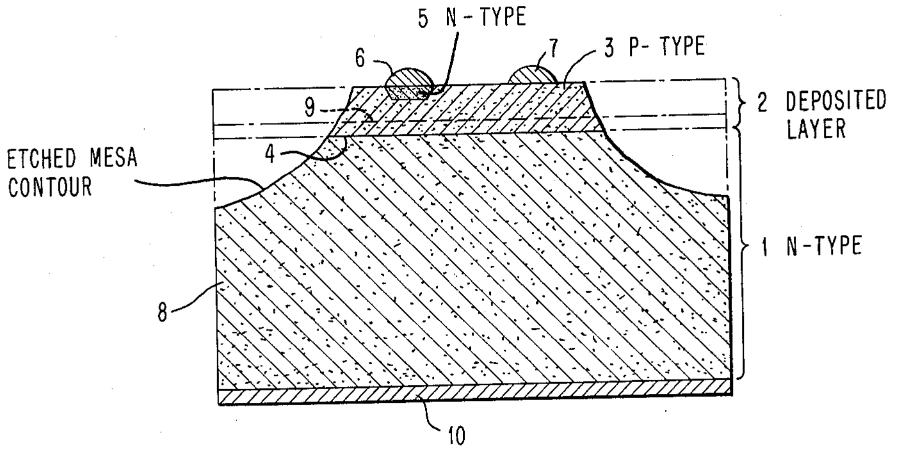
FIG. 1 shows in section an embodiment of a high speed switching transistor in accordance with the present invention.

Referring now to FIG. 1, there is shown a junction transistor particularly adapted for high speed operation. The transistor includes a semiconductor body whose substrate region 1 will serve substantially as the collector of the finally fabricated transistor. A thin region 2 is situated on top of the substrate region 1 and a section thereof designated 3 will serve as the base zone of the transistor. The initial junction is designated 4 and exists at the interface between the substrate region 1 and the thin layer 2. The emitter zone 5 is shown at the top of the layer 2, on the left. Emitter electrode 6 and base electrode 7 make contact to their respective active zones 5 and 3. The collector zone is designated 8, and ohmic contact 10 is made on one surface thereof. As will be explained hereafter, base zone 3 is characterized by a net impurity concentration which is graded from a relatively high value near the emitter zone 5 to a relatively low value near the collector zone 8 thus providing a built-in field, which adds a drift component to the flow of minority carriers from the emitter to the collector.

In accordance with a specific example of the technique of the present invention, the substrate region 1 is degenerately doped, that is, to a high level, on the order of $1\times10^{19}$ atoms per cc. The impurity is chosen for the particular example to be n-conductivity-type determining in the selected semiconductor material, which, typically, would be germanium. A suitable impurity for this purpose would be arsenic. The next step in accordance with the technique of the present invention is to deposit a thin layer 2, on the order of .5 mils in thickness, onto the substrate region 1. This layer is chosen in this example to be p-conductivity-type by means of appropriate doping. The layer 2 may be epitaxially deposited by a vapor deposition process involving a halide disproportionation reaction or similar reaction such as is now well known in the art, for example in J. C. Marinace Patent 3,047,438, issued on July 31, 1962, and assigned to the assignee of the present invention. The layer 2 is of the maximum doping level permissible consistent with maintaining the necessary emitter-base breakdown characteristics. The layer or region 2 is doped to the order of $5\times10^{17}$ atoms per cc. in this example.

A junction 4 exists initially at the interface between the substrate region 1, which is degenerately doped n-type, and the deposited layer or region 2, which is uniformly doped p-type. A diffusion step is now carried out by heating the semiconductor body, constituted of substrate region 1 and deposited layer 2, so as to cause diffusion of impurities from the substrate region 1 into the deposited layer 2. If required, a mask may be placed on the surface of the wafer so as to prevent "out" diffusion of impurities from the surface.

Figure 2:
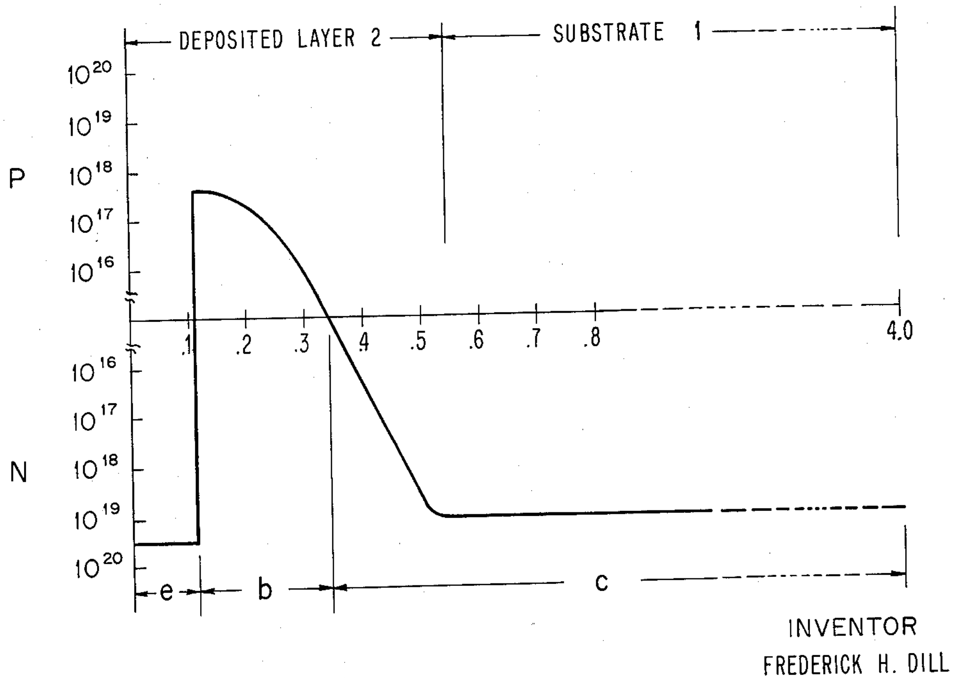
FIG. 2 shows a plot of the net impurity concentration profile in the emitter, base and collector regions of the semiconductor body of FIG. 1.

As a result of the diffusion step, a significant change in the impurity concentration has taken place in the deposited layer 2, and this change is depicted in the impurity concentration profile drawing in FIG. 2 indicating that a gradient in impurity concentration now exists in the deposited layer 2. Effectively then, the junction between the different conductivity regions of the body has been changed and has moved up into the deposited region of the body 2, and is now designated 9 in FIG. 1. It is to be noted that the repositioning of the junction is advantageous in that the junction is removed from a somewhat disordered layer, which will exist at the interface of the substrate, and deposited layer 2.

The diffusion step is continued until the necessary base-collector breakdown voltage is obtained. Typically, the diffusion step for producing the collector junction would be carried out for a time period on the order of five hours, at 600° C. for germanium. The diffusion step also produces, as a matter of course, the desired base zone 3, constituted of that section of layer 2 above junction 9, which zone is graded in the region of the collector junction 9, as may be seen by referring to FIG. 2. However, the exposed surface of the deposited layer 2 will still be very near its original doping since the diffusion which has taken place outwardly from the substrate region 1 is not permitted to penetrate that far. It is to be noted that the collector zone 8 is constituted of the substrate region 1 plus that portion of the deposited layer 2 below the junction 9.

The emitter zone 5 is formed by a step well known in the art, which consists essentially in bringing the desired impurity into contact with the semiconductor body on the top surface thereof. The emitter zone 5 can be formed in this way either by an alloying operation or by diffusing the impurity into the top surface of the body. If the emitter zone were to be formed by diffusion, this could be done simultaneously with the formation of the collector junction as previously described. In the example chosen, the emitter zone is produced by alloying the impurity. The impurity is, of course, selected so as to determine a conductivity of opposite type to that of the base zone 3. A base connection is now made in accordance with a standard technique so as to provide ohmic contact between electrode 7 and base zone 3. Contact is made to the collector zone 8 by an ohmic contact designated 10. As indicated in FIG. 1, the semiconductor body is etched away so as to provide the desired mesa contour.

The emitter-base breakdown is determined by (a) the doping of the base zone, which is uniform in the vicinity of the emitter, as may be verified by reference to FIG. 2, and by (b) the doping of the emitter zone, which is quite high as obtained by a standard alloying or diffusion technique, the result of the former technique being illustrated in FIG. 1. Additionally, the emitter-base breakdown is determined by the grading of the emitter-base junction. In the instant case of alloying of the emitter, there will be almost no grading while there would be slight grading if diffusion of impurities in forming the emitter were used.

An additional embodiment in accordance with the teaching of the present invention contemplates construction of the transistor on a collector substrate which consists of a bulk of heavily doped semiconductive material, on the order of $5 \times 10^{19}$ atoms per cc., and a thin skin of more lightly doped semiconductive material, on the order of $1 \times 10^{18}$ atoms per cc. This would give the smaller collector capacitance and higher collector junction breakdown voltage associated with conventional epitaxial transistors, without much affecting other transistor characteristics. The fabrication of the base and emitter regions would be identical to the previously described embodiment.

The construction of a high speed switching transistor in accordance with the teaching of the present invention will have a higher emitter-base breakdown for a given base doping because of the fact that the base layer does not have a very high surface concentration as is obtained for ordinary diffused base structures. At the same time, the base resistance of this transistor will be low due to the peculiar nature of the impurity distribution curve which is "convex" across the base zone, as may be seen by reference to FIG. 2.

A further advantage of the proposed epitaxial transistor is that it will have a small value of collector storage due to the fact that a heavily doped substrate, serving substantially as the collector, has been utilized. Additionally, the transistor will have relatively lower base storage in the region adjacent the collector due to the high compensation of the semiconductor in this region. Further, the transistor will have the low collector saturation voltage normally present in a conventional epitaxial transistor.

While the invention has been particularly shown and described with reference to a preferred embodiment thereof, it will be understood by those skilled in the art that various changes in form and details may be made therein without departing from the spirit and scope of the invention.

What is claimed is:

1. A process of fabricating a high speed switching transistor comprising the steps of forming a semiconductor body of a doped substrate of one predetermined conductivity-type and a differently doped thin layer contiguous therewith of semiconductor material of opposite conductivity-type to said substrate; heating the semiconductor body thus formed so as to cause diffusion of the impurities from said substrate into said thin layer thereby to create a graded concentration of impurities in a first major portion of said thin layer and a uniform concentration of impurities in the remaining surface portion of said thin layer, thereby to produce a graded base region; and making contact to the surface of said thin layer so as to establish in said surface portion a zone of opposite conductivity type to said surface and making ohmic contact at said surface to said base region.

2. A process of fabricating a high speed switching transistor as defined in claim 1 including the further step of making ohmic contact to the surface of said substrate.

3. A process of making a high speed transistor as defined in claim 1 wherein at least part of said semiconductor substrate is doped to a level of approximately $5 \times 10^{19}$ atoms per cc., said thin layer is initially doped to a level of approximately $5 \times 10^{17}$ atoms per cc., and said zone of opposite conductivity-type in the surface of said thin layer is doped to a level of approximately $5 \times 10^{19}$ atoms per cc.

4. A process of fabricating a high speed switching transistor comprising the steps of forming a semiconductor body of a highly doped substrate of one predetermined conductivity-type and a moderately doped thin layer contiguous therewith of semiconductor material of opposite conductivity-type to said substrate; heating the semiconductor body thus formed so as to cause diffusion of the impurities from said substrate into said thin layer so as to create two zones within said body, a first, base zone, with a first, minor portion thereof having a uniform concentration of impurities and the remaining portion thereof having a graded concentration of impurities, and a second, collector zone, with a first portion thereof having a graded concentration of impurities and the remaining portion thereof having a uniform concentration of impurities, and making contact to the surface of said thin layer so as to establish in said surface portion a zone of opposite conductivity type to said surface and making ohmic contact at said surface to said base region.

5. A process of fabricating a high speed switching transistor comprising the steps of providing a highly doped semi-conductor substrate of one predetermined conductivity-type; depositing a moderately doped thin layer of semiconductor material of opposite conductivity-type to said substrate upon said substrate; heating the semiconductor body thus formed so as to cause diffusion of the impurities from said substrate into said deposited layer thereby to produce a graded concentration of impurities in a, major portion of said deposited layer and a uniform concentration of impurities in the remaining portion of said deposited layer, thereby to produce a graded base region; and making contact to the surface of said thin layer so as to establish in said surface portion a zone of opposite conductivity type to said surface and making ohmic contact at said surface to said base region.

6. A process of fabricating a high speed switching transistor as defined in claim 5 including the further step of making ohmic contact to the surface of said substrate.

7. A process of making a high speed transistor as defined in claim 5 wherein said semiconductor substrate is doped to a level of approximately $1\times10^{19}$ atoms per cc., said deposited layer is initially doped to a level of approximately $5\times10^{17}$ atoms per cc. and said zone of opposite conductivity-type in the surface of said deposited layer is doped to a level of approximately $5\times10^{19}$ atoms per cc.

8. A process of fabricating a high speed switching transistor comprising the steps of providing a highly doped semiconductor substrate of one predetermined conductivity-type; depositing a moderately doped thin layer of semiconductor material of opposite conductivity-type to said substrate upon said substrate; heating the semiconductor body thus formed so as to cause diffusion of the impurities from said substrate into said deposited layer thereby to create two zones within said body, a first, base zone, with a first, minor portion thereof having a uniform concentration of impurities and the remaining portion thereof having a graded concentration of impurities, and a second, collector zone, with a first portion thereof having a graded concentration of impurities and the remaining portion thereof having a uniform concentration of impurities, thereby to produce a graded base region; and making contact to the surface of said thin layer so as to establish in said surface portion a zone of opposite conductivity type to said surface and making ohmic contact at said surface to said base region.

9. A process of fabricating a high speed switching transistor having contiguous opposite conductivity-type zones comprising the steps of forming a semiconductor body of a highly doped semiconductor substrate of one predetermined conductivity-type and a less highly doped thin layer of semiconductor material of opposite conductivity-type to said substrate contiguous said substrate; heating the semiconductor body thus formed so as to cause diffusion of the impurities present in said substrate across the interface between said substrate and said thin layer thereby to create a gradient of concentration of said impurities, in a, major portion of said thin layer and to produce a graded base region therein, said graded concentration corresponding to a reverse error function curve having its highest value immediately contiguous said substrate so that the junction between opposite conductivity-type zones in said body is produced in said thin layer, thereby to produce a graded base region; and making contact to the surface of said thin layer so as to establish in said surface portion a zone of opposite conductivity type to said surface and making ohmic contact at said surface to said base region.

References Cited by the Examiner

UNITED STATES PATENTS

| | | | |
|---|---|---|---|
| 2,964,689 | 12/1960 | Buschert et al. | 317—235 |
| 3,006,791 | 10/1961 | Webster | 317—235 |
| 3,015,048 | 12/1961 | Noyce | 29—25.3 X |
| 3,025,589 | 3/1962 | Hoerni | 29—25.3 |
| 3,027,503 | 3/1962 | Sato | 317—235 |
| 3,067,485 | 12/1963 | Ciccolella et al. | 29—25.3 |
| 3,089,794 | 5/1963 | Marinace | 148—175 X |
| 3,149,395 | 9/1964 | Bray et al. | 148—175 X |

OTHER REFERENCES

Epitaxial Diffused Transistors, H. C. Theuerer et al., Proceedings of the IRE, September 1960, pages 1642, 43. (Received by the IRE, July 5, 1960.)

WHITMORE A. WILTZ, *Primary Examiner.*

JAMES D. KALLAM, JOHN F. CAMPBELL, *Examiners.*